United States Patent
Ohno et al.

(10) Patent No.: US 8,747,689 B2
(45) Date of Patent: Jun. 10, 2014

(54) LIQUID PROCESSING METHOD, LIQUID PROCESSING APPARATUS AND STORAGE MEDIUM

(75) Inventors: Hiroki Ohno, Yamanashi (JP); Takehiko Orii, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 174 days.

(21) Appl. No.: 13/355,709

(22) Filed: Jan. 23, 2012

(65) Prior Publication Data

US 2012/0187088 A1  Jul. 26, 2012

(30) Foreign Application Priority Data

Jan. 25, 2011  (JP) .................................. 2011-013473

(51) Int. Cl.
*B44C 1/22* (2006.01)

(52) U.S. Cl.
USPC ............... 216/99; 216/96; 216/104; 438/689; 438/745

(58) Field of Classification Search
USPC ......... 156/345.1, 345.15, 345.18; 216/85, 90, 216/93, 99; 438/424, 5, 594, 689, 707, 745, 438/746; 73/61.46
See application file for complete search history.

(56) References Cited

U.S. PATENT DOCUMENTS

2002/0086552 A1 * 7/2002 Saito et al. .................... 438/745
2005/0230045 A1 * 10/2005 Okuchi et al. ............ 156/345.18

FOREIGN PATENT DOCUMENTS

JP  2002-246378 A  8/2002
JP  2006-108716 A  4/2006

* cited by examiner

*Primary Examiner* — Duy-Vu Deo
*Assistant Examiner* — Erin Bergner
(74) *Attorney, Agent, or Firm* — Pearne & Gordon LLP (57) ABSTRACT

There are provided a liquid processing method and a liquid processing apparatus capable of providing a high etching rate and a high etching selectivity for silicon nitride against silicon oxide, and a storage medium storing the method thereon. In the method for etching, by an etching solution, a substrate on which silicon nitride and silicon oxide are exposed, the etching solution is produced by mixing a fluorine ion source material, water and a boiling point adjusting agent; the produced etching solution is heated to a substrate processing temperature equal to or higher than 140° C.; after a temperature of the etching solution reaches the substrate processing temperature, the temperature of the etching solution is maintained at the substrate processing temperature for a first preset time; and after a lapse of the first preset time, the substrate is etched by the etching solution maintained at the substrate processing temperature.

7 Claims, 12 Drawing Sheets

LIQUID PROCESSING METHOD, LIQUID PROCESSING APPARATUS AND STORAGE MEDIUM

CROSS-REFERENCE TO RELATED APPLICATION

This application claims the benefit of Japanese Patent Application No. 2011-013473 filed on Jan. 25, 2011, the entire disclosures of which are incorporated herein by reference.

FIELD OF THE INVENTION

The present disclosure relates to a technique for etching silicon nitride.

BACKGROUND OF THE INVENTION

A semiconductor manufacturing process includes a process of selectively etching and removing a SiN (silicon nitride) film on a substrate in which the SiN film and a $SiO_2$ (silicon oxide) film are exposed. As an etching method for selectivity etching the SiN film, Patent Document 1 describes a technique of heating an etching solution containing hydrogen fluoride (HF), sulfuric acid ($H_2SO_4$) and water ($H_2O$) up to a boiling point temperature thereof and performing an etching process by using the heated etching solution. However, in Patent Document 1, in order to shorten a processing time, an etching rate needs to be higher, and a ratio (selectivity) of an etching rate of the SiN film to an etching rate of the $SiO_2$ film is not sufficiently high.

Patent Document 1: Japanese Patent Laid-open Publication No. 2002-246378 (Claim 16, paragraphs [0093] to [0098] and FIG. 18)

BRIEF SUMMARY OF THE INVENTION

In view of the foregoing problems, the present disclosure provides a liquid processing method and a liquid processing apparatus capable of providing a high etching rate and a high etching selectivity for silicon nitride against silicon oxide. Further, the present disclosure also provides a storage medium storing the liquid processing method thereon.

In accordance with an aspect of the present disclosure, there is provided a liquid processing method for etching, by using an etching solution, a substrate on which silicon nitride and silicon oxide are exposed. The liquid processing method includes: producing the etching solution by mixing a fluorine ion source material, water and a boiling point adjusting agent; controlling the temperature of the etching solution to be equal to or higher than about 140° C. for a preset time required for making an etching rate of the silicon nitride equal to or higher than about 100 Å/min and for making a ratio of the etching rate of the silicon nitride to an etching rate of the silicon oxide equal to or higher than about 75 when the substrate is etched by the etching solution; and etching the substrate by the etching solution maintained for the preset time at the temperature equal to or higher than about 140° C.

The liquid processing apparatus may have the following features. The fluorine ion source material may be hydrogen fluoride or ammonium fluoride. Further, the boiling point adjusting agent may be sulfuric acid or dimethylsulfoxide. Furthermore, the temperature equal to or higher than about 140° C. may be lower than a temperature at which the etching solution boils.

In accordance with an illustrative embodiment, the etching solution produced by mixing the fluorine ion source material, the water and the boiling point adjusting agent is maintained at the temperature equal to or higher than about 140° C. Accordingly, the etching solution can be made suitable for selectively etching the silicon nitride, and the etching rate of the silicon nitride can be set to be equal to or higher than about 100 Å/min and the ratio of the etching rate of the silicon nitride to the etching rate of the silicon oxide can be set to be equal to or higher than about 75.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
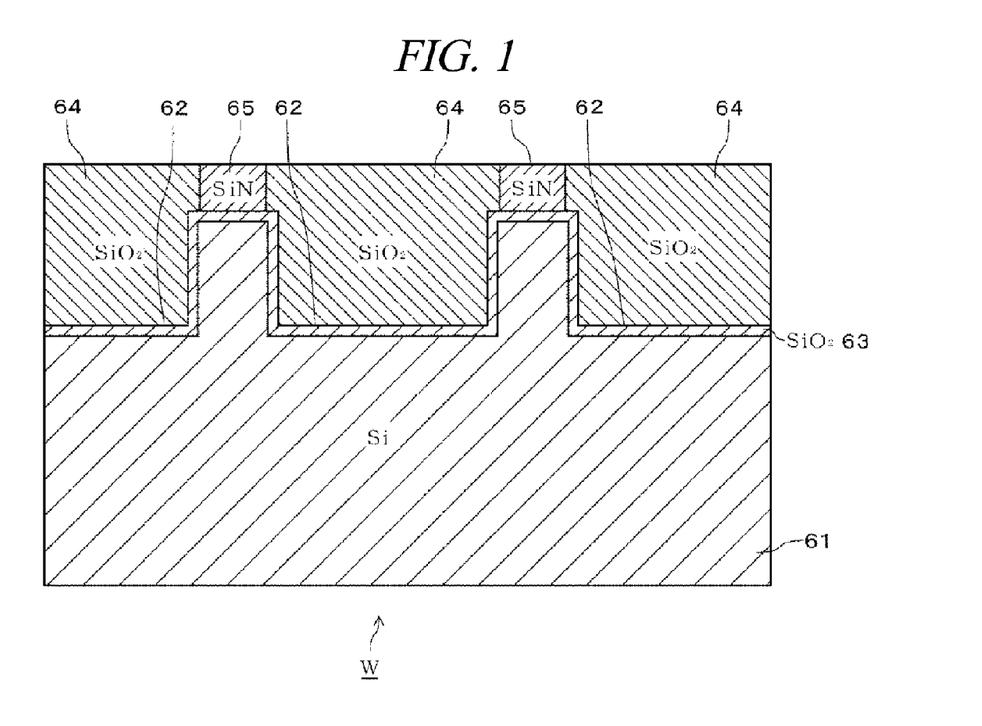
FIG. 1 is a cross sectional view illustrating a wafer surface before an etching process in accordance with an illustrative embodiment is performed.
Figure 2:
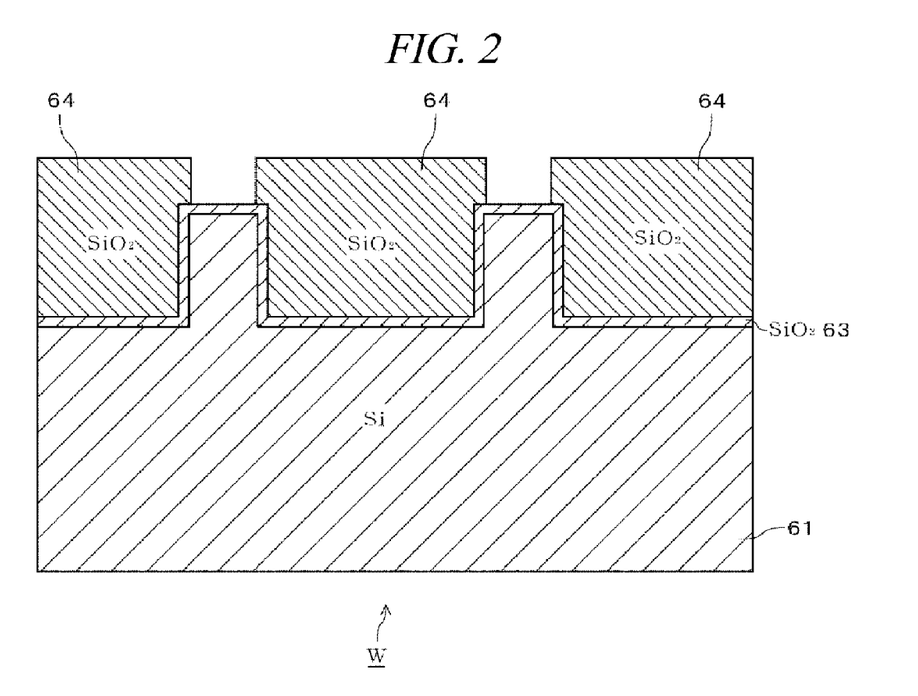
FIG. 2 is a cross sectional view illustrating a wafer surface after the etching process is performed.

Prior to describing a detailed configuration of a liquid processing apparatus 1 in accordance with an illustrative embodiment of the present disclosure, an example structure of a wafer W (substrate) on which an etching process is performed by the liquid processing apparatus 1 will be first described briefly with reference to FIGS. 1 and 2. A wafer W shown in FIG. 1 has thereon a silicon film 61 having a multiple number of recesses 62. A $SiO_2$ film 63 is formed on the silicon film 61, and another $SiO_2$ film 64 is formed on the $SiO_2$ film 63. Accordingly, the inside of the recesses 62 is filled with the $SiO_2$ film 64. The $SiO_2$ film 64 is formed such that its upper portion protrudes higher than the uppermost portion of the recesses 62. The $SiO_2$ film 64 formed on protrusions between neighboring recesses 62 is etched to be removed, and a SiN film 65 is formed on the protrusions. Accordingly, on a front surface of the wafer W, the SiN film 65 and the SiO$_2$ film 64 are exposed. The liquid processing apparatus 1 is configured to selectively etch the SiN. Thus, the SiN film 65 can be removed from the front surface of the wafer W, as illustrated in FIG. 2, for example.

The configuration of the liquid processing apparatus 1 having the aforementioned function will be explained with reference to FIGS. 3 to 5. As shown in a transversal plane view of FIG. 3, the liquid processing apparatus 1 includes a mounting block 11, a loading/unloading block 12, a transit block 13 and a liquid processing block 14. The mounting block 11 is configured to mount thereon FOUPs 100 each for accommodating a multiple number of wafers W therein. The loading/unloading block 12 is configured to load and unload the wafers W with respect to the FOUPs 100 mounted on the mounting block 11. The transit block 13 is configured to transit the wafers W between the loading/unloading block 12 and the liquid processing block 14 that is located at a rear end of the liquid processing apparatus 1. The liquid processing block 14 is configured to perform a liquid process on the wafers W.

In the mounting block 11, the FOUPs 100 for accommodating therein the multiple wafers W horizontally are mounted on mounting tables 111. The loading/unloading block 12 serves to transfer the wafers W, and the transit block 13 serves to transit the wafers W.

The loading/unloading block 12 includes a first wafer transfer device 121. The first wafer transfer device 121 includes a transfer arm 122 for holding a wafer W thereon; and a device for moving the transfer arm 122 back and forth. Further, the first wafer transfer device 121 further includes a device configured to move along a horizontal guide 123 elongated in an arrangement direction of the FOUPs 100; a device configured to move along a non-illustrated vertical guide; and a device configured to rotate the transfer arm 122 on a horizontal plane. The wafer W is transferred by the first wafer transfer device 121 between the FOUPs 100 and the transit block 13.

The transit block 13 includes a transit shelf 131 for mounting the wafer W thereon. In the transit block 13, the wafer W is transferred between transfer devices of the loading/unloading block 12 and the liquid processing block 14 (i.e., between the aforementioned first wafer transfer device 121 and a second wafer transfer device 143 to be described later) via the transit shelf 131.

The liquid processing block 14 includes liquid processing sections 141 and a transfer section 142 that are arranged in a housing. Multiple liquid processing units 2 are disposed in each liquid processing section 141, and the wafer W is transferred in the transfer section 142. The transfer section 142 has the second wafer transfer device 143 in a space elongated in a forward/backward direction from a connection part to the transit block 13 as a base. The second wafer transfer device 143 includes a transfer arm 144 for holding thereon the wafer W and a device for moving the transfer arm 144 back and forth. The second wafer transfer device 143 further includes a device configured to move along a horizontal guide 145 elongated in the forward/backward direction; a device configured to move along a non-illustrated vertical guide; and a device configured to rotate the transfer arm 144 on a horizontal plane. The wafer W can be transferred by the second wafer transfer device 143 between the transit shelf 131 and each liquid processing unit 2.

In the liquid processing section 141, a multiple number of, e.g., six liquid processing units 2 are horizontally arranged adjacent to each other in a direction along which the space forming the transfer section 142 is elongated. The liquid processing sections 141 are arranged in two rows with the transfer section 142 therebetween. Accordingly, in total, twelve liquid processing units 2 are provided in the liquid processing apparatus 1 in accordance with the present embodiment.

The liquid processing unit 2 provided in each liquid processing section 141 is configured to hold the wafer W therein horizontally and supply an etching solution to the front surface (top surface) of the wafer W while rotating the wafer W about a vertical axis. Accordingly, the SiN film 65 exposed on the front surface of the wafer W can be selectively etched. As illustrated in FIG. 4, the liquid processing unit 2 includes a spin chuck 24, a rotation shaft 251, a lifter 252, a nozzle 28, an inner cup 23 and an outer cup 22. The spin chuck 24 attracts and holds the wafer W thereon. The rotation shaft 251 supports the spin chuck 24 from a bottom surface thereof and is configured to rotate the spin chuck 24. The lifter 252 is inserted through the inside of the rotation shaft 251 and serves to move the wafer W up and down when the wafer W is transferred to/from the transfer arm 144. Further, the nozzle 28 supplies the etching solution to the front surface of the wafer W. The inner cup 23 is configured to receive the etching solution scattered from the wafer W being rotated, and, then, discharge the received etching solution to the outside. The outer cup 22 accommodates the spin chuck 24 and the inner cup 23 therein, and is configured to exhaust an atmosphere within the liquid processing unit 2.

The spin chuck 24 is a circular plate-shaped member having an opening at a center thereof. The spin chuck 24 has a non-illustrated suction hole opened at a top surface thereof and connected with a vacuum pump for attracting and holding the wafer W from a rear surface (bottom surface) of the wafer W.

The rotation shaft 251 for supporting the spin chuck 24 from a bottom surface thereof is rotatably held on a bearing 253 provided on a base plate 27 within the liquid processing section 141. A bottom end portion of the rotation shaft 251 protrudes downwardly from the base plate 27, and a pulley 264 is provided at the bottom end portion of the rotation shaft 251. Further, a motor 261 is provided near the rotation shaft 251, and a pulley 262 is also provided at a rotation shaft of the motor 261. A driving belt 263 is wound between the two pulleys 262 and 264. The motor 261, the two pulleys 262 and 264, and the driving belt 263 serve as rotation devices for the rotation shaft 251. By driving the motor 261, the rotation shaft 251 can be rotated at a desired rotation speed. The spin chuck 24, the rotation shaft 251 and the rotation devices 261 to 264 thereof correspond to a substrate holding unit in accordance with the present embodiment.

Supporting pins for supporting the wafer W from the rear surface thereof are provided on an upper surface of the lifter 252. Further, an elevation motor 265 configured to move the lifter 252 up and down is provided at a lower end of the lifter 252. By moving up and down the entire part of the lifter 252, the lifter 252 can be protruded from or retracted into the opening of the spin chuck 24. As the lifter 252 is moved in this way, the wafer W can be moved up and down, while being held on the supporting pins, between a transfer position where the wafer W is transferred from/to the transfer arm 144 and a holding position on the spin chuck 24.

The inner cup 23 is a circular ring-shaped member surrounding the wafer W held on the spin chuck 24. The etching solution received in the inner cup 23 can be discharged through a liquid drain pipe 231 connected to a bottom surface of the inner cup 23. The outer cup 22 serves to exhaust an air current introduced from a gap between the inner cup 23 and the outer cup 22. A gas exhaust line 221 is connected to a bottom surface of the outer cup 22. Further, openings are formed at top surfaces of the outer cup 22 and the inner cup 23, and the diameters of the openings are larger than the diameter of the wafer W. The wafer W supported on the lifter 252 can be moved up and down through these openings. This liquid processing unit 2 corresponds to an etching unit in accordance with the present embodiment.

The nozzle 28 for supplying the etching solution to the top surface of the wafer W is supported by a nozzle arm 281 and is configured to be moved between a processing position above the wafer W held on the spin chuck 24 and a retreated position from this processing position. The nozzle 28 is connected with an etching solution supply system for supplying the etching solution to the top surface of the wafer W.

Figure 5:
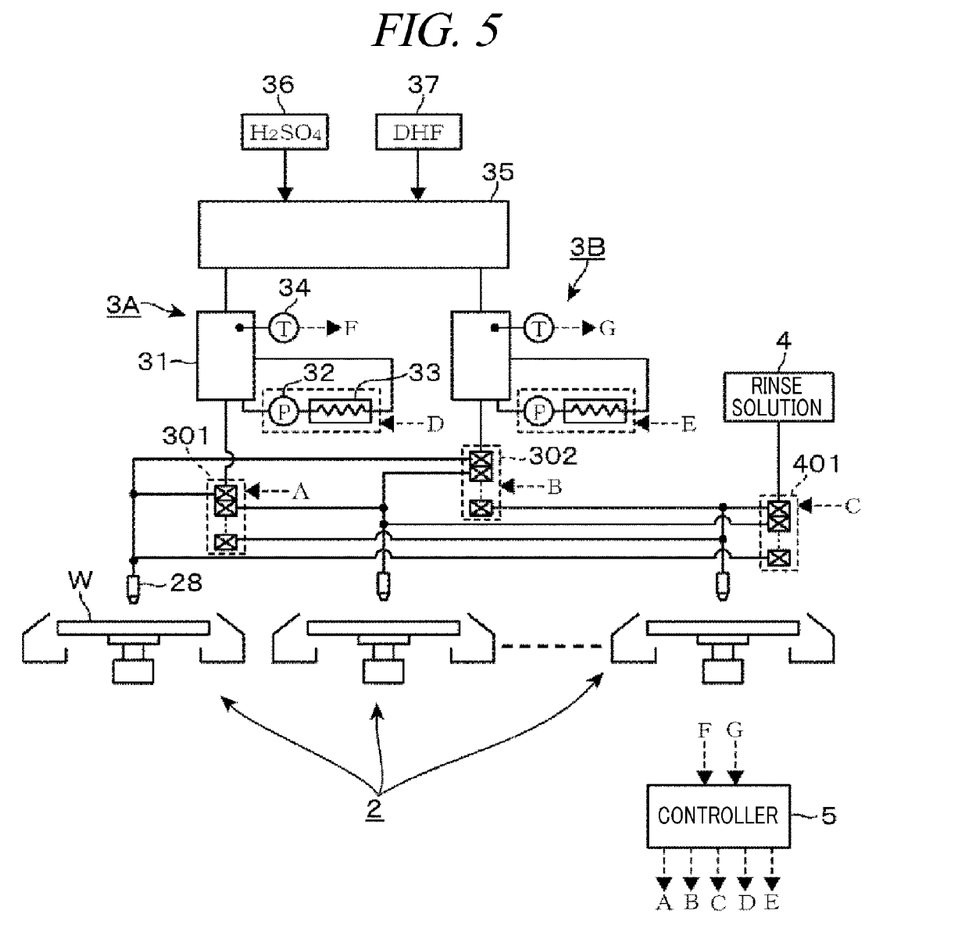
FIG. 5 is an explanatory diagram illustrating an example etching solution supply system for supplying an etching solution into the liquid processing unit.

Now, a configuration of the etching solution supply system for supplying the etching solution into each liquid processing unit 2 will be elaborated with reference to FIG. 5. The liquid processing apparatus 1 in accordance with the first embodiment uses an etching solution containing a fluorine ion source material, water and a boiling point adjusting agent. Although hydrogen fluoride (HF) or ammonium fluoride ($NH_4F$), for example, may be suitable for the fluorine ion source material, another material may also be used as long as it is capable of supplying fluorine ions ($F^+$) in the etching solution. The water serves to supply hydroxide ions ($OH^-$) in the etching solution. It is deemed that SiN is etched by actions of the fluorine ions and the hydroxide ions.

Here, by increasing a temperature of the etching solution containing the fluorine ions and the water, the fluorine ions or the hydroxide ions are activated, and, thus, etching selectivity for the SiN can be improved. Meanwhile, if the etching solution is further heated to be evaporated, the fluorine ions may disappear, resulting in a decrease of an etching rate. The boiling point adjusting agent serves to increase a boiling point of the etching solution, and, thus, a decrease of a concentration of the fluorine ions in the heated etching solution can be suppressed. By way of non-limiting example, a compound, such as sulfuric acid ($H_2SO_4$) or dimethylsulfoxide (($CH_3)_2SO$), having a function of increasing a boiling point of an aqueous solution may be used as the boiling point adjusting agent.

Although a concentration of each component of the etching solution may not be particularly limited to a certain range, it may be possible that the etching solution contains, but not limited to, about 0.005 wt % to about 0.02 wt % of fluorine ion source material; about 70 wt % to about 95 wt % of boiling point adjusting agent; and water of the remaining portion. A surfactant may be further added to the etching solution having the aforementioned composition, and this surfactant may allow the etching solution to be easily introduced into the fine structure filled with the SiN film 65, as shown in FIG. 1.

The liquid processing apparatus 1 in accordance with the present embodiment includes a sulfuric acid reservoir 36 and a fluoric acid reservoir 37 as source material reservoirs for storing source materials of the aforementioned etching solution. For example, about 80 wt % of concentrated sulfuric acid is stored in the sulfuric acid reservoir 36, and about 0.01 wt % of dilute hydrofluoric acid is stored in the fluoric acid reservoir 37. The sulfuric acid reservoir 36 and the fluoric acid reservoir 37 are connected to a mixing tank 35 as a mixing unit. In the mixing tank 35, an etching solution containing a fluorine ion source material (HF), water and a boiling point adjusting agent ($H_2SO_4$) of desired concentrations is prepared, and then is supplied into each liquid processing unit 2. The mixing tank 35, the sulfuric acid reservoir 36, and the fluoric acid reservoir 37 correspond to the etching solution supply unit in accordance with the present embodiment.

Further, the liquid processing apparatus 1 in accordance with the present embodiment further includes heating units 3A and 3B between the mixing tank 35 and the nozzle 28 of each liquid processing unit 2. By heating the etching solution in the heating units 3A and 3B, the etching solution can be supplied to the wafer W while an etching rate and selectivity for the SiN are increased. Here, the fluorine ions contained in the etching solution may also serve to etch the $SiO_2$. Accordingly, if the etching solution is supplied to the front surface of the wafer W on which the SiN and the $SiO_2$ are exposed, both the SiN and the $SiO_2$ may be etched.

For this reason, the present inventors have searched for conditions capable of selectively etching the SiN at a high etching rate by using the aforementioned etching solution. As a result, as can be seen in experimental examples to be described later, the present inventors have found out that, if the etching solution is heated to and maintained at a certain temperature equal to or higher than about 140° C., there exists timing when an etching rate of the SiN becomes equal to or higher than about 100 Å/min and a ratio of the etching rate of the SiN to an etching rate of the $SiO_2$ (hereinafter, referred to as "selectivity") becomes equal to or higher than about 75.

The reason behind this timing is supposed as follows. If a time period for maintaining the etching solution at the temperature of about 140° C. or higher is short, a composition ratio between the fluorine ions and the hydroxide ions in the etching solution may not be appropriate, and the SiN and the $SiO_2$ may be etched simultaneously so that a high selectivity may not be obtained. If this time period is too long, on the other hand, the concentration of the fluorine ions may be greatly reduced due to vaporization of the etching solution. As a result, this is regarded that the etching rate of the SiN may be decreased.

Therefore, the heating units 3A and 3B in the liquid processing apparatus 1 in accordance with the present embodiment are configured to heat the etching solution supplied from the mixing tank 35 and maintain the etching solution at a temperature equal to or higher than about 140° C., e.g., about 170° C. for a preset time until the etching rate becomes equal to or higher than about 100 Å/min, e.g., about 175 Å/min and the selectivity becomes equal to or higher than about 75, e.g., about 78. Here, the preset time may be determined through previously performed experiments.

In order to obtain the above-described effect, each of the heating units 3A and 3B in accordance with the present embodiment includes a heating tank 31 for storing therein the etching solution while the etching solution is being heated; a heating device 33 configured to heat the etching solution; a circulation pump 32 configured to circulate the etching solution between the heating tank 31 and the heating device 33; and a pipe member connecting these components. In FIG. 5, a reference numeral 34 denotes a temperature detector for detecting a temperature of the inside of the heating tank 31.

The heating tank 31 serves to store the heated etching solution in, e.g., an atmospheric atmosphere. The heating tank 31 is connected with a non-illustrated gas exhaust pipe, and vapor evaporated from the etching solution is exhausted to the outside, e.g., to an exhaust gas scrubber through the gas exhaust pipe. The heating device 33 may be configured as a heat exchanger for heating the etching solution by a heat medium such as heated vapor or high-temperature oil. Alternatively, the heating device 33 may heat the etching solution by winding a tape heater around the pipe member. The heating device 33 may not be particularly limited as long as it has a function of heating the etching solution to a desired temperature.

By heating the etching solution to the temperature equal to or higher than about 140° C., desirably, equal to or higher than about 165° C., the hydroxide ions or the fluorine ions necessary for etching the SiN can be easily generated. There is no specific upper limit in the heating temperature and, thus, the etching solution can be heated to a maximum temperature within a tolerance range of the apparatus. However, if the etching solution boils, the concentration of the fluorine ions would be greatly reduced. Thus, it may be desirable to maintain the etching solution at a temperature lower than the boiling point thereof, e.g., about 190° C. or below.

As will be explained in an illustrative embodiment to be described later, the time during which the etching rate of the SiN becomes equal to or higher than about 100 Å/min and the selectivity becomes equal to or higher than about 75 ranges from several minutes to several tens of minutes. Thus, it takes time before the etching solution is ready to be supplied to each liquid processing unit 2. Accordingly, the liquid processing apparatus 1 in accordance with the present embodiment has multiple heating units 3A and 3B, and these multiple heating units 3A and 3B can prepare the etching solution simultaneously (i.e., maintain the temperature of the etching solution at about 140° C. or higher during the preset time period). Although the two heating units 3A and 3B are shown in FIG. 5, the number of the heating units 3A and 3B may not be limited thereto. By way of example, the number of the heating units 3A and 3B may be appropriately selected depending on the number of the liquid processing units 2, the time required for heating the etching solution (i.e. time for raising the temperature or time for maintaining the etching solution at the temperature equal to or higher than about 140° C.), a supply amount of the etching solution for one process, or the like.

A supply target of the etching solution prepared in each of the heating units 3A and 3B is selected by switching valves 301 and 302, and the etching solution is supplied into the nozzle 28 of the selected liquid processing unit 2 accommodating therein the wafer W to be processed.

In FIG. 5, a reference numeral 4 denotes a rinse solution supply unit for supplying a rinse solution such as pure water for removing the etching solution from the wafer W after the wafer W is processed, and a reference numeral 401 denotes a switching valve thereof.

Figure 3:
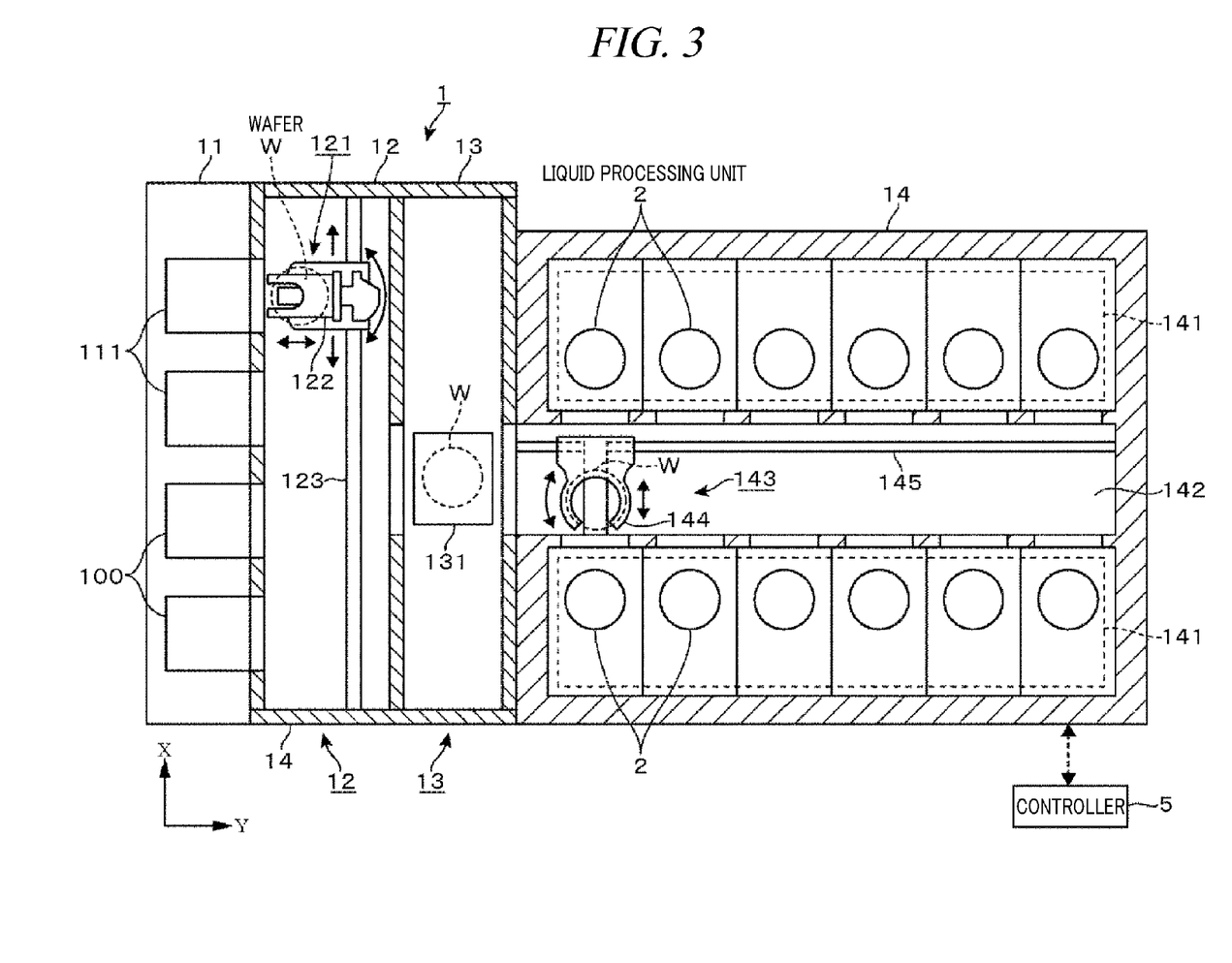
FIG. 3 is a transversal plane view of a liquid processing apparatus configured to perform the etching process.

The liquid processing apparatus 1 having the above-described configuration is connected with a controller 5, as illustrated in FIGS. 3 and 5. The controller 5 includes a computer (not shown) having, e.g., a CPU and a storage unit. The storage unit stores therein programs including control steps (commands) for controlling operations of the liquid processing apparatus 1, i.e., processes for loading the wafer W into the liquid processing apparatus 1; etching the wafer W; rinsing the wafer W; and unloading the wafer W from the liquid processing apparatus 1. These programs may be stored in a storage medium such as a hard disk, a compact disk, a magneto-optical disk, or a memory card, and may be installed on the computer by being retrieved from the storage medium.

As illustrated in FIG. 5, specifically, the controller 5 of the liquid processing apparatus 1 in accordance with the present embodiment is connected with the circulation pumps 32, the heating devices 33, the temperature detectors 34 and the switching valves 301 and 302 of the heating units 3A and 3B. The controller 5 is configured to output control signals to each component so as to heat the etching solution to the preset temperature equal to or higher than about 140° C. and maintain the etching solution at this temperature for the preset time. The temperature of the etching solution in each heating tank 31 is detected by the temperature detector 34, and the detected temperature is inputted to the controller 5.

Now, an operation of the liquid processing apparatus 1 having the above-described configuration will be explained. First, a single sheet of wafer W is taken out of the FOUP 100 mounted on the mounting block 11 by the first wafer transfer device 121, and, then, is loaded on the transit shelf 131. This operation is repetitively performed. The wafer W loaded on the transit shelf 131 is transferred to the transfer section 142 by the second wafer transfer device 143, and loaded into one of the liquid processing units 2 and held on the spin chuck 24.

Figure 6:
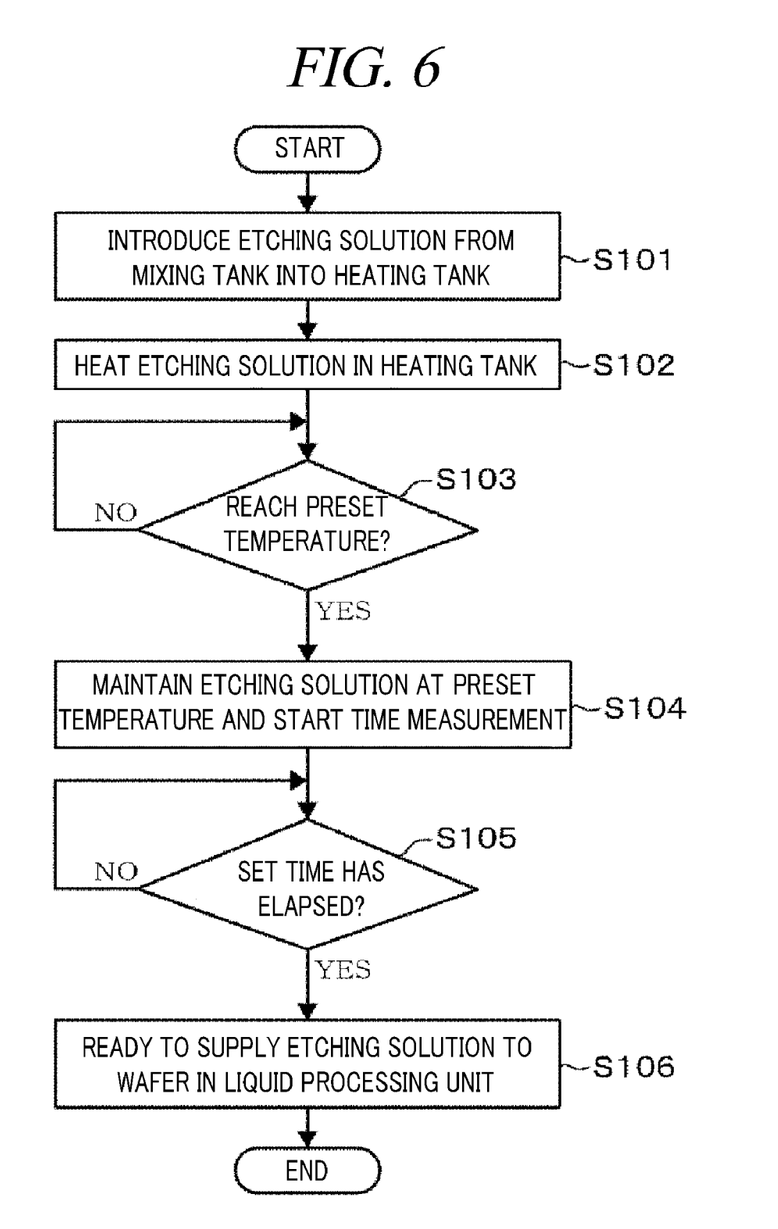
FIG. 6 is a flowchart for describing an operation sequence of a heating tank provided in the etching solution supply system.

Concurrently with these operations, the etching solution supply system is operated as depicted in a flowchart of FIG. 6. Sulfuric acid and DHF are introduced into the mixing tank 35 at a certain mixing ratio from the sulfuric acid reservoir 36 and the fluoric acid reservoir 37, and, then, is mixed by a non-illustrated mixer or the like. In this way, a room-temperature etching solution containing a fluorine ion source material (HF), water and a boiling point adjusting agent ($H_2SO_4$) at a preset mixing ratio is prepared. When the heating units 3A and 3B are ready to introduce the etching solution (Start), the etching solution is sent into the heating tank 31 from the mixing tank 35 (process S101).

Each of the heating units 3A and 3B introduces a certain amount of etching solution into the heating tank 31 and heats the etching solution in the heating tank 31 by operating the circulation pump 32 and the heating device 33 (process S102). Then, the etching solution within the heating tank 31 is heated until the etching solution reaches the preset temperature equal to or higher than about 140° C. (e.g., about 170° C.) (process S103; NO). Once the etching solution reaches the preset temperature (process S103; YES), the temperature of the etching solution is constantly maintained at the preset temperature by controlling an output of the heating device 33, and, at the same time, time measurement is started (process S104).

This state is maintained for a set time (e.g., 6 minutes) until the etching rate becomes equal to or higher than about 100 Å/min (e.g., about 175 Å/min) and the selectivity becomes equal to or higher than about 75 (e.g., about 78) (process S105; NO). After the lapse of the set time (process S105; YES), each heating unit is turned into a standby state where the etching solution is ready to be supplied to the wafer W within the liquid processing unit 2 (process S106, End). Here, the preset temperature is equivalent to a temperature of the etching solution when the etching process is performed on the substrate (substrate processing temperature).

At this time, in the liquid processing unit 2, the wafer W held on the spin chuck 24 is rotated by driving the rotation shaft 251. If the rotation speed reaches a set value, the switching valves 301 and 302 of the heating units 3A and 3B are operated, so that the etching solution is supplied from the nozzle 28 to a central portion of the front surface of the wafer W. The etching solution supplied to the wafer W is dispersed over the entire surface of the wafer W by centrifugal force and comes into contact with the SiN and the $SiO_2$ exposed at the front surface of the wafer W. At this time, since the etching solution has been maintained at the temperature equal to or higher than about 140° C. in the heating units 3A and 3B for the preset time, it is possible to selectively etch the SiN with the etching rate equal to or higher than about 100 Å/min and the selectivity equal to or higher than about 75.

As an example method for controlling the timing for preparing for the etching solution supply in the heating units 3A and 3B and the timing for performing the etching process in each liquid processing unit 2 will be explained. Based on a process schedule and a transfer schedule of the wafer W in each liquid processing unit 2, by performing a reverse calculation from the timing when the etching solution is ready to be supplied to the wafer W, the heating units 3A and 3B may introduce the etching solution, heat the etching solution and maintain the heated state thereof. Accordingly, before the activity of the etching solution prepared to be optimal for etching the SiN is deteriorated, it is possible to supply the etching solution to the front surface of the wafer W.

Figure 7:
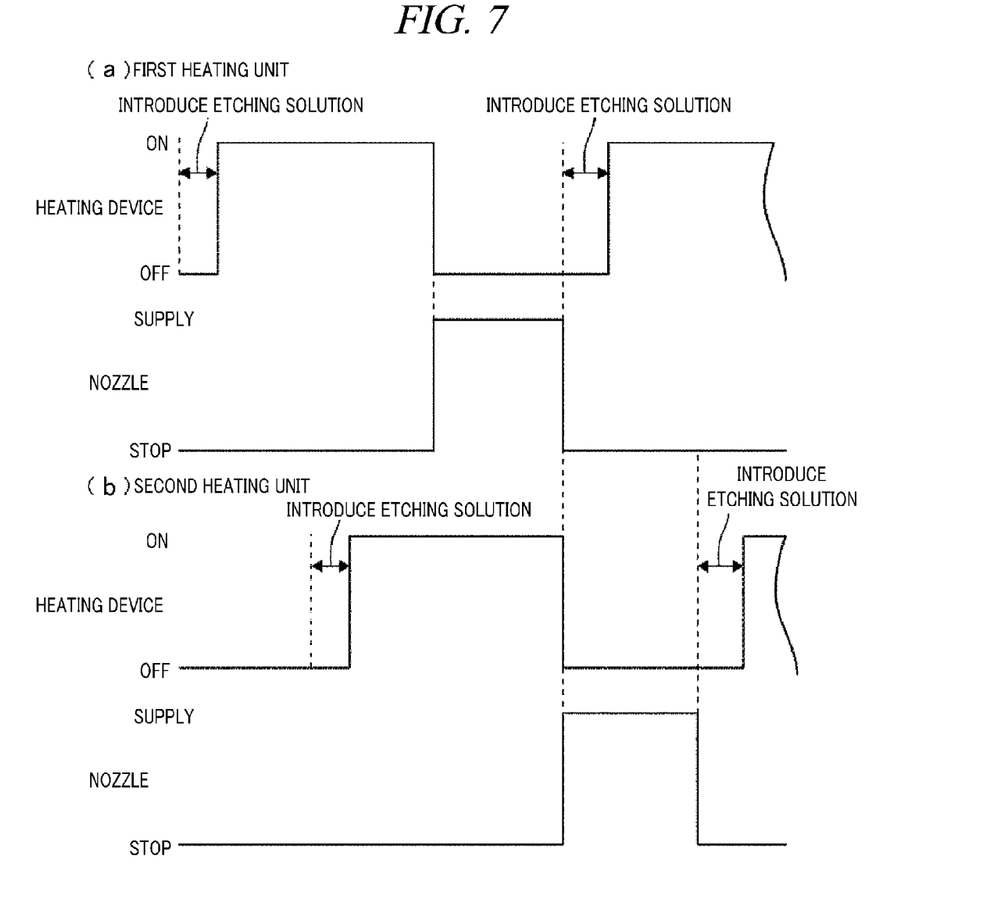
FIG. 7 is a time chart for describing a heating operation for the heating tank and an operation of supplying the etching solution from the heating tank.

By way of example, the heating unit 3A and the heating unit 3B are referred to as a first heating unit and a second heating unit, respectively. Here, as shown in a time chart of FIG. 7, a supply process of the etching solution into the first heating unit 3A and the second heating unit 3B, a heating process by the heating devices 33 and a supply process of the etching solution into the nozzles 28 may be performed at different timings corresponding to the transfer timing of the wafer W into each liquid processing unit 2. Actually, the liquid processing apparatus 1 includes a sufficient number of heating units 3A and 3B, corresponding to the number of the liquid processing units 2 provided in the liquid processing section 141. Accordingly, the timing when the wafer W is transferred into the liquid processing unit 2 and the liquid processing unit 2 is ready to start the etching process can be made coincident with the timing when the heating units 3A and 3B are ready to supply the etching solution. As a result, it is possible to supply the etching solution having a high etching rate and a high selectivity for the SiN into each liquid processing unit based on the process schedule and the transfer schedule of the wafer W.

The etching solution within the heating tank 31 is supplied at a certain supply speed for a certain supply time. If the SiN film 65 exposed on the front surface of the wafer W is etched to be removed as shown in FIG. 2, the supply of the etching solution to the wafer W is stopped. Then, by switching the switching valve 401 of the rinse solution supply unit 4, the rinse solution is supplied to the wafer W being rotated, and the etching solution remaining on the front surface of the wafer W is rinsed away by the rinse solution. Thereafter, the supply of the rinse solution is stopped, and, in the meantime, by keeping on rotating the wafer W, a drying process for removing the rinse solution is performed. Then, a series of liquid processes in the liquid processing unit 2 are ended.

The transfer arm 144 unloads the processed wafer W from the liquid processing unit 2 in which the liquid process is completed, and, then, mounts the wafer W on the transit shelf 131. Then, the wafer W is returned back into the FOUP 100 from the transit shelf 131 by the first wafer transfer device 121. Liquid processes are performed on a multiple number of wafers W one by one by the multiple liquid processing units 2 of the liquid processing apparatus 1.

In the liquid processing unit 2 in accordance with the present embodiment, the etching solution prepared by mixing the fluorine ion source material (HF or $NH_4F$), the water and the boiling point adjusting agent ($H_2SO_4$ or $(CH_3)_2SO$) is maintained at the temperature equal to or higher than about 140° C. Thus, the etching solution can be made suitable for selectively etching the silicon nitride, and the etching rate of the SiN can be set to be equal to or higher than about 100 Å/min and the selectivity for the SiN can be set to be equal to or higher than about 75. Here, it has been observed that, by performing the etching process using the etching solution as compared to a case of using plasma or the like, a less damage is inflicted on the wafer W having a stacked structure of semiconductors, and a higher selectivity can be obtained.

Figure 8:
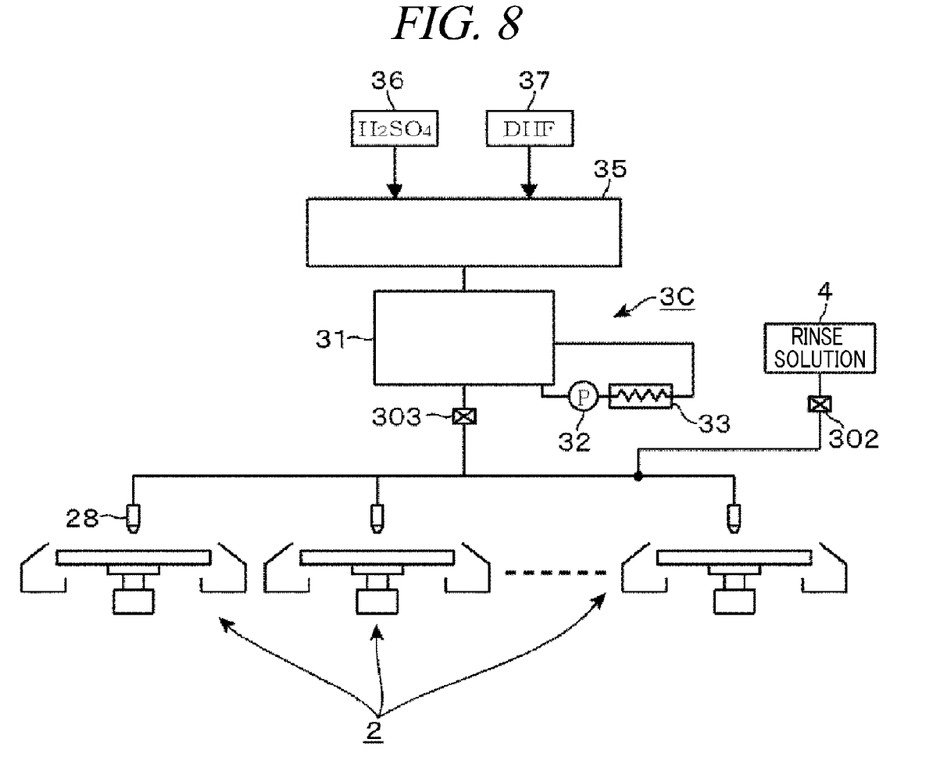
FIG. 8 is an explanatory diagram illustrating another example etching solution supply system.

The etching solution supply system for supplying the etching solution to the liquid processing unit 2 may not be limited to the example shown in FIG. 5. By way of example, as illustrated in FIG. 8, there may be provided a heating unit 3C having a heating tank 31 capable of storing therein an amount of etching solution for etching a multiple number of wafers W. This heating unit 3C may be connected with multiple liquid processing units 2. In such a configuration, the etching solution may be prepared to be supplied at the timing when wafers W are completely transferred into all liquid processing units 2 connected to the heating unit 3C. If the transfer of the wafers W is completed, an opening/closing valve 303 is opened and the etching solution is supplied into the respective liquid processing units 2 simultaneously, so that the SiN is etched in each liquid processing unit 2.

Figure 9:
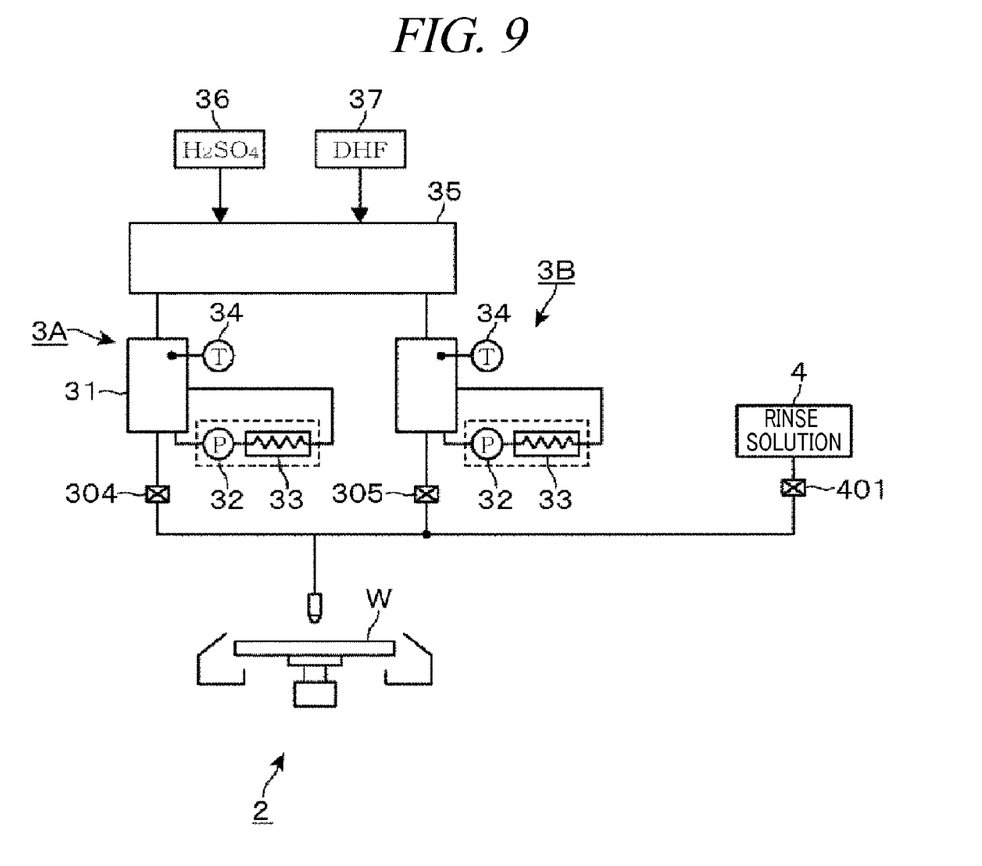
FIG. 9 is an explanatory diagram illustrating still another example etching solution supply system.

Further, if a time period for supplying the etching solution to a single wafer W is lengthened, the etching rate or the selectivity of the SiN may be deteriorated. Accordingly, as shown in FIG. 9, a single liquid processing unit 2 may be also connected to plural heating units 3A and 3B, and the etching solution may be prepared in the plural heating units 3A and 3B at different timings. In such a case, by delaying the timing for supplying the etching solution to the nozzle 28 by opening/closing valves 304 and 305, it may be possible to supply the etching solution still having the high etching rate and the high selectivity for the SiN even in case that the etching time is lengthened. Although FIG. 9 shows a configuration in which the plural heating units 3A and 3B are connected to the single liquid processing unit 2 for the simplicity of illustration, the aforementioned method for delaying the timing for supplying the etching solution into the single liquid processing unit 2 by the plural heating units 3A and 3B may also be applicable to the etching solution supply system having the plural heating units 3A and 3B connected to each of the multiple liquid processing units 2 as shown in FIG. 5.

Moreover, in the examples depicted in FIGS. 5, 8 and 9, it is shown that the heating device 33 is provided separately from the heating tank 31. However, the configuration of the heating device may not be limited to such examples. By way of example, a tape heater may be wound around the heating tank 31 to heat a main body of the heating tank 31.

Further, for example, by pre-heating the etching solution in the mixing tank 35 to a temperature below about 140° C., e.g., about 50° C. to about 100° C., a temperature raising time in the heating units 3A and 3B can be shortened.

In addition, after a temperature of the etching solution reaches about 140° C. or higher, for the time period during which, the temperature of the etching solution is maintained, the temperature may be regulated constant or may be fluctuated. In case that the temperature is fluctuated, time may be measured starting from when the temperature of the etching solution reaches about 140° C., or starting after the temperature of the etching solution reaches a preset temperature (e.g., about 170° C.). The time period can be specified by checking a relationship between a temperature rise profile of the etching solution, the etching rate of the SiN and the selectivity for the SiN through preliminary experiments.

Besides, the mixing tank 35 as a part of the etching solution supply system may be omitted. By way of example, it may be possible to prepare the etching solution by supplying sulfuric acid or DHF into the heating tanks 31 of the heating units 3A and 3B directly from the sulfuric acid reservoir 36 and the fluoric acid reservoir 37, and then, to prepare the supply of the etching solution into the liquid processing unit 2.

Figure 4:
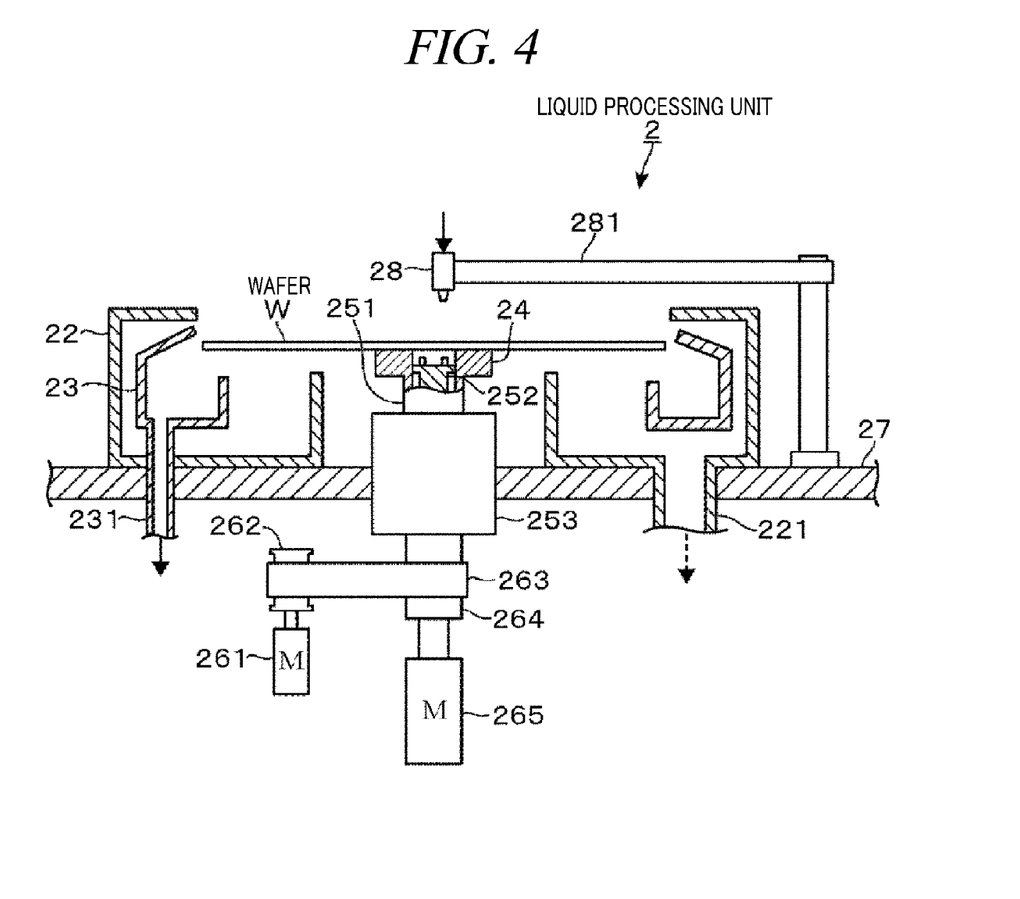
FIG. 4 is a longitudinal side view of a liquid processing unit provided in the liquid processing apparatus.

Moreover, in the liquid processing apparatus 1 shown in FIGS. 3 to 5, the liquid processing unit 2 is described to supply the etching solution while rotating the wafer W about a vertical axis thereof, i.e., to perform an etching process by a so-called spin coating method. However, the configuration of the etching unit may not be limited thereto. By way of example, a nozzle 28 having a wide opening may be provided above a horizontally held wafer W, and the etching solution may be discharged to the wafer W while the nozzle 28 is moved. With this configuration, the etching solution is supplied over the entire surface of the wafer W in a stationary state (scan coating method).

Further, it may be also possible to prepare an immersion type etching unit. In the immersion type etching unit, the etching solution is prepared in a processing vessel, and wafers W are immersed in the etching solution one by one or in groups while arranged vertically or horizontally. In such a case, the processing vessel of the etching unit may also be configured as the heating tanks 31 of the heating units 3A and 3B.

In the example of the wafer W illustrated in FIGS. 1 and 2, the entire $SiO_2$ film 64 and SiN film 65 are exposed at the front surface of the wafer W. However, it may be also possible to perform patterning by covering a part of these films 64 and 65 with a resist film and etching a part of the SiN film 65.

EXPERIMENTAL EXAMPLES

Etching solutions are prepared by mixing a fluorine ion source material, water and a boiling point adjusting agent. Then, etching processes are performed by supplying, by a spin coating method, the etching solutions to surfaces of wafers W on which SiN and $SiO_2$ are exposed, while varying time for maintaining the etching solutions at the temperature equal to or higher than about 140° C.

A. Condition for Experiments

The etching solutions having compositions as specified below are heated to about 170° C. Then, while varying time for maintaining this temperature from about 0 minute to about 12 minutes (from about 0 minute to about 9 minutes in Experimental example 3), the etching solutions are supplied to the wafers W, and etching rates of the SiN and the $SiO_2$ and selectivity therebetween are measured. In each etching process, about 1000 ml of the etching solution is supplied for about 3 minutes to the front surface of the wafer W being rotated at about 100 rpm.

Experimental Example 1

Composition of Etching Solution
Fluorine ion source material: HF (about 0.05 wt %), $NH_4F$ (about 0.05 wt %)
Water (about 14.21 wt %)
Boiling point adjusting agent: $H_2SO_4$ (about 85.69 wt %)

Experimental Example 2

Composition of Etching Solution
Fluorine ion source material: HF (about 0.12 wt %), $NH_4F$ (about 0.12 wt %)
Water (about 23.61 wt %)
Boiling point adjusting agent: $H_2SO_4$ (about 76.15 wt %)

Experimental Example 3

Composition of Etching Solution
Fluorine ion source material: HF (about 0.12 wt %), $NH_4F$ is not added
Water (about 24.4 wt %)
Boiling point adjusting agent: $H_2SO_4$ (about 75.48 wt %)
Concentrations of each composition of each etching solution in accordance with Experimental examples 1 to 3 are provided in Table 1.

TABLE 1

| | Fluorine ion source | | Boiling point adjusting agent | |
|---|---|---|---|---|
| | HF | $NH_4F$ | $H_2O$ | $H_2SO_4$ |
| Experimental example 1 | 0.05 | 0.05 | 14.21 | 85.69 |
| Experimental example 2 | 0.12 | 0.12 | 23.61 | 76.15 |
| Experimental example 3 | 0.12 | 0 | 24.4 | 75.48 |

B. Experiment Result

Figure 10:
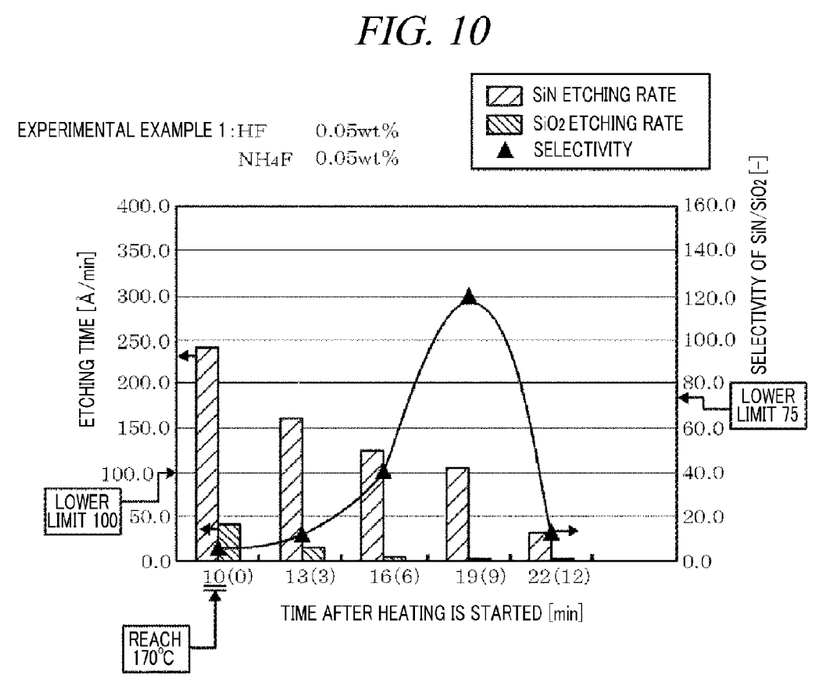
FIG. 10 is a first explanatory diagram showing an experiment result of an experimental example.
Figure 11:
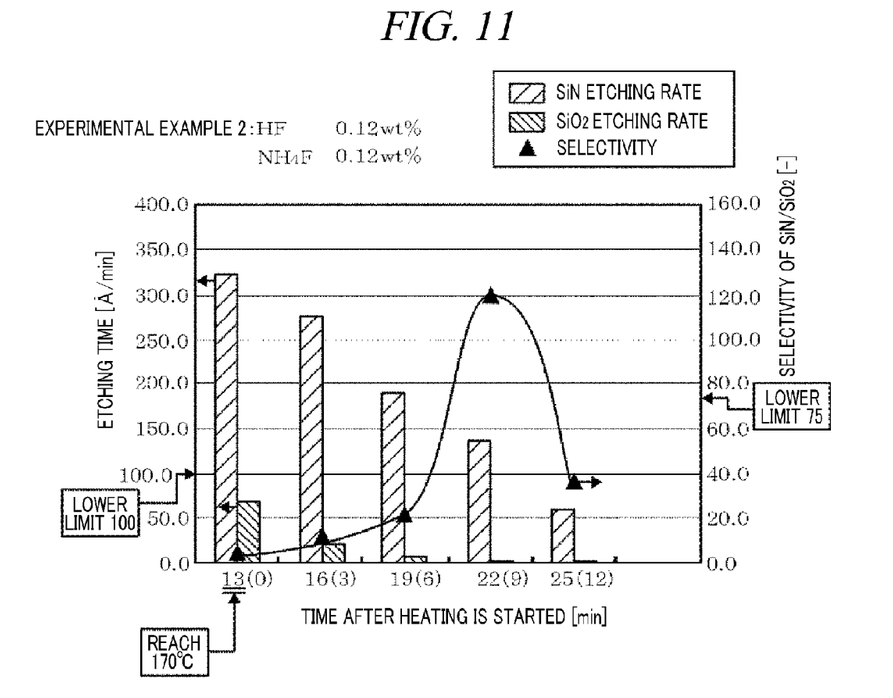
FIG. 11 is a second explanatory diagram showing an experiment result of an experimental example.
Figure 12:
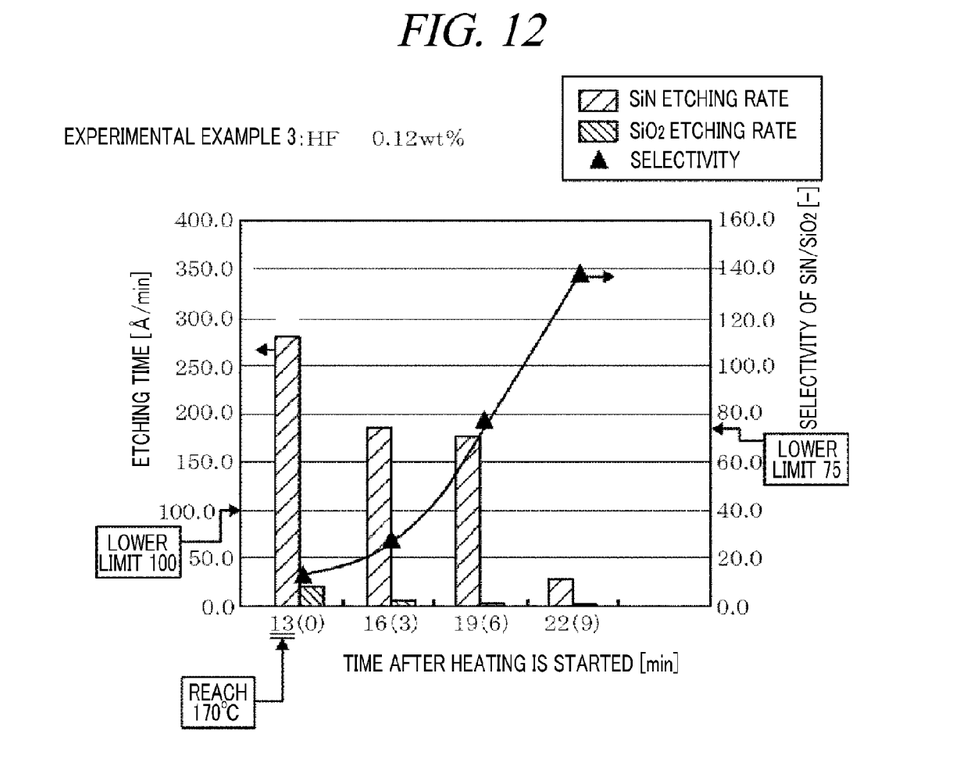
FIG. 12 is a third explanatory diagram showing an experiment result of an experimental example.

Experiment results of Experimental examples 1 to 3 are shown in FIGS. 10 to 12. In each graph, a horizontal axis represents time that has passed after the etching solution is begun to be heated. Time (referred to as "elapsed time") that has passed after the temperature of the etching solution reaches about 170° C. (i.e., time during which the etching solution is maintained at about 170° C.) is also specified in parentheses. A left vertical axis represents etching rates (Å/min) of the SiN and the $SiO_2$, and a right vertical axis indicates selectivity which is defined as '(an etching rate of SiN)/(an etching rate of $SiO_2$).'

At each elapsed time, the etching rate of the SiN is indicated by a column hatched with dashed lines rising to the right, and the etching rate of the $SiO_2$ is indicated by a column hatched with dashed lines descending to the right. Further, the selectivity is plotted by a black triangle '▲'.

As can be seen from the result of Experimental example 1 shown in FIG. 10, the etching solution etches the SiN more than the $SiO_2$. Further, with an increase of the elapsed time after the temperature of the etching solution reaches about 170° C., it is found that the etching rates of both the SiN and the $SiO_2$ are reduced. It is deemed to be because the concentration of the fluorine ions in the etching solution decreases with the lapse of time after the etching solution is started to be heated. Meanwhile, the selectivity is found to be increased, and then, decreased with the increase of the elapsed time, forming a convex shape that is tapered toward a top. Further, it is also found out that the etching rate of the SiN becomes about 100 Å/min or higher and the selectivity becomes about 75 or higher at timing when the elapsed time is about 9 minutes.

In the result of Experimental example 2 shown in FIG. 11, almost the same tendency as that shown in Experimental example 1 is observed. Etching rates of the SiN and the $SiO_2$ are found to decrease with the increase of elapsed time after the temperature of the etching solution reaches about 170° C., and selectivity is found to be increased, and then, decreased with an increase of the elapsed time, forming a convex shape that is tapered toward a top. Further, it is also found out that the etching rate of the SiN becomes about 100 Å/min or higher and the selectivity becomes about 75 or higher at timing when the elapsed time is about 9 minutes.

The result of Experimental example 3 shown in FIG. 12 is the same as those of Experimental examples 1 and 2 in that etching rates of the SiN and the $SiO_2$ decrease with an increase of elapsed time after the temperature of the etching solution reaches about 170° C. Meanwhile, selectivity is found to be increased with the increase of the elapsed time, and no peak as shown in FIGS. 10 and 11 is observed within a time range in which the experiment is performed. However, since the etching solution is not heated for a time longer than about 9 minutes during which the etching rate of the SiN is below a lower limit (about 100 Å/min), the same tendency as in Experimental examples 1 and 2 may also be observed if the etching solution is heated for a longer time. In this Experimental example 3, it is observed that the etching rate of the SiN becomes about 100 Å/min or higher and the selectivity becomes about 75 or higher at timing when the elapsed time is about 6 minutes.

From the experiment results as described above, it is found out that for each etching solution, there exists timing when the etching rate of the SiN becomes about 100 Å/min or higher and the selectivity becomes about 75 or higher even if the composition of the etching solution containing the fluorine ions source material, the water and the boiling point adjusting agent is varied. Further, it is also found out that such timing also exists in a case where the heating temperature of the etching solution is about 140° C.

What is claimed is:

1. A liquid processing method for etching, by using an etching solution, a substrate on which silicon nitride and silicon oxide are exposed, the method comprising:

producing the etching solution by mixing a fluorine ion source material, water and a boiling point adjusting agent;

introducing the produced etching solution into a first heating unit and a second heating unit;

heating the etching solution by the first heating unit and the second heating unit to a substrate processing temperature equal to or higher than about 140° C.;

after a temperature of the etching solution reaches the substrate processing temperature, maintaining the temperature of the etching solution at the substrate processing temperature for a first preset time; and after a lapse of the first preset time, etching the substrate by supplying the etching solution maintained at the substrate processing temperature, wherein heating the etching solution in the first heating unit is performed at a different timing from heating the etching solution in the second heating unit, so that a timing when the substrate is ready to be etched is coincident with a timing when the first heating unit or the second heating unit is ready to supply the etching solution after the lapse of the first preset time.

2. The liquid processing method of claim 1, wherein the first preset time is a time required for making an etching rate of the silicon nitride equal to or higher than about 100 Å/min and for making a ratio of the etching rate of the silicon nitride to an etching rate of the silicon oxide equal to or higher than about 75 when the substrate is etched by the etching solution.

3. The liquid processing method of claim 1, wherein etching the substrate is performed for a second preset time, starting from when the temperature of the etching solution reaches the substrate processing temperature.

4. The liquid processing method of claim 3, wherein the second preset time is a time for maintaining the etching rate of the silicon nitride at a level equal to or higher than about 100 Å/min and for maintaining the ratio of the etching rate of the silicon nitride to the etching rate of the silicon oxide at a level equal to or higher than about 75 when the substrate is etched by the etching solution.

5. The liquid processing method of claim 1, wherein the fluorine ion source material is hydrogen fluoride or ammonium fluoride.

6. The liquid processing method of claim 1, wherein the boiling point adjusting agent is sulfuric acid or dimethylsulfoxide.

7. The liquid processing method of claim 1, wherein the substrate processing temperature is lower than a temperature at which the etching solution boils.

* * * * *